(12) United States Patent
Popp et al.

(10) Patent No.: US 6,924,225 B2
(45) Date of Patent: Aug. 2, 2005

(54) METHOD FOR PRODUCING AN ELECTRICALLY CONDUCTIVE CONTACT

(75) Inventors: Martin Popp, Dresden (DE); Dietmar Temmler, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/893,561

(22) Filed: Jul. 16, 2004

(65) Prior Publication Data

US 2005/0079702 A1 Apr. 14, 2005

(30) Foreign Application Priority Data

Jul. 17, 2003 (DE) .................................. 103 32 600

(51) Int. Cl.[7] ......................................... H01L 21/8242
(52) U.S. Cl. ..................................... 438/626; 438/645
(58) Field of Search ............................... 438/626, 645

(56) References Cited

U.S. PATENT DOCUMENTS

| | | | |
|---|---|---|---|
| 5,118,640 A | 6/1992 | Fujii et al. | |
| 5,863,837 A | 1/1999 | Sudo | |
| 6,287,905 B2 | 9/2001 | Kim et al. | |
| 6,306,759 B1 * | 10/2001 | Yen et al. | 438/637 |
| 6,475,847 B1 * | 11/2002 | Ngo et al. | 438/201 |
| 2002/0024085 A1 | 2/2002 | Nakamura et al. | |
| 2002/0076866 A1 * | 6/2002 | Cherng et al. | 438/180 |
| 2003/0008453 A1 | 1/2003 | Kang et al. | |
| 2004/0067653 A1 * | 4/2004 | Peng et al. | 438/694 |
| 2004/0209429 A1 * | 10/2004 | Lin et al. | 438/279 |

FOREIGN PATENT DOCUMENTS

| | | |
|---|---|---|
| DE | 199 35 852 A1 | 2/2001 |
| EP | 0 439 965 A2 | 8/1991 |
| EP | 0 797 250 A2 | 9/1997 |

OTHER PUBLICATIONS

Yoon, K.H., et al., "A New Storage Node Pad Formation Technology—Line Type SAC with Oxide Spacer (LSOS) and Direct Metal Plug (DMP)—for 0.115$\mu$m Tech and Beyond," Symposium on VLSI Technology Digest of Technical Papers (2001) pp. 129-130.

Yoon, T., et al., "A New Process Integration—P³ (Pre Poly Plug)—for Giga Bit DRAM Era," Symposium on VLSI Technology Digest of Technical Papers (1999) pp. 37-38.

Noh, H., et al., "A 0.115$\mu$m$^2$ 8F$^2$ DRAM Working Cell with LPRD (Low_Prasitic_Resistance Device) and Poly Metal Gate Technology for Gigabit DRAM," Symposium on VLSI Technology Digest of Technical Papers (2001) pp. 25-26.

* cited by examiner

*Primary Examiner*—Alexander Ghyka
(74) *Attorney, Agent, or Firm*—Slater & Matsil, L.L.P.

(57) ABSTRACT

An electrically conductive contact can be used to connect an integrated component to an interconnect. A sacrificial layer is deposited on a liner and planarized until a surface of the integrated component is uncovered. The sacrificial layer is patterned to define the later contacts. The layer is covered in a partial region above contact connection regions. An interlevel insulator is deposited and patterned, so that the sacrificial layer can then be stripped out from the partial region. After the removal of the liner, a conductive layer is deposited into the cavity formed as a result of the stripping-out process on the uncovered contact connection regions and optionally into trenches formed at the outset within the interlevel insulator.

35 Claims, 14 Drawing Sheets

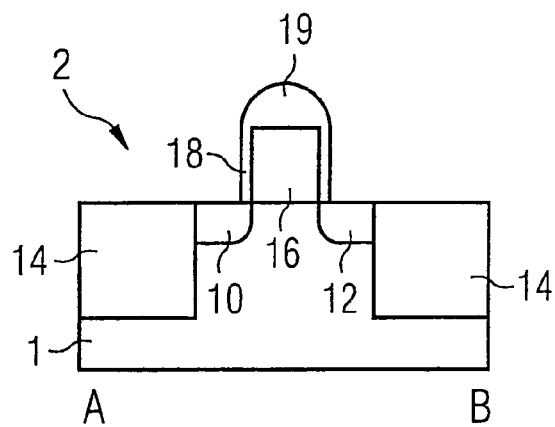
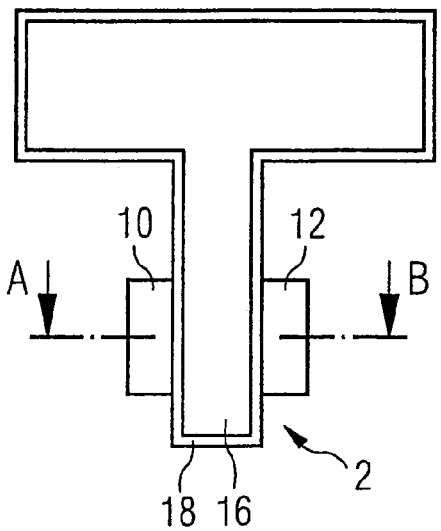
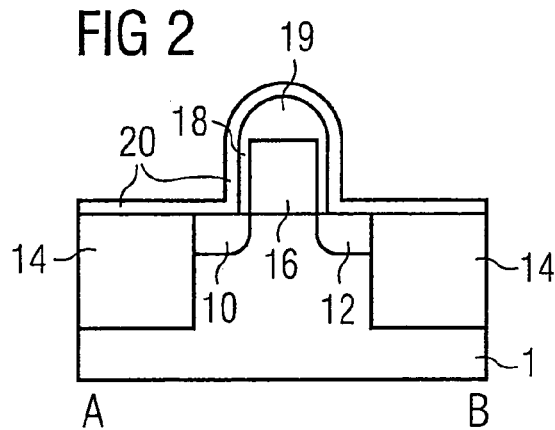
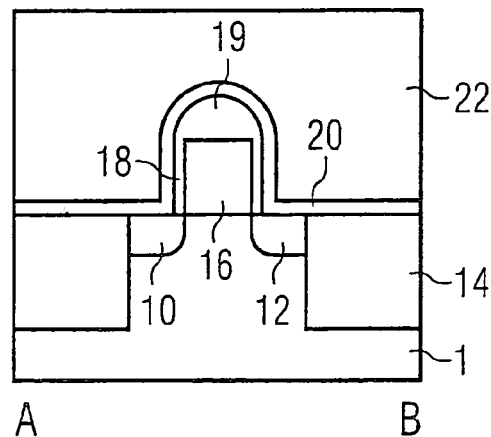

METHOD FOR PRODUCING AN ELECTRICALLY CONDUCTIVE CONTACT

This application claims priority to German Patent Application 103 32 600.6, which was filed Jul. 17, 2003 and is incorporated herein by reference.

TECHNICAL FIELD

The present invention generally relates to semiconductors and, in particular, the preferred embodiment relates to a method for producing an electrically conductive contact to at least one doped region of an integrated component.

BACKGROUND

In the production of integrated circuits, it is generally attempted to integrate the components used to construct these circuits in a manner that saves as much space as possible. In circuits such as memory chips, for instance, where there is a particularly great need to achieve an integration density that is as high as possible, the structural dimensions of the components are often at the resolution limit of the lithographic projection system used to form the structures.

On the other hand, the formation of the smallest possible areas for the doped regions of the components is often at odds with the condition of a minimum size for the contact area for connection to interconnects for connecting to other components. This is justified primarily with the disadvantageously increasing contact resistances toward smaller contact areas.

Therefore, the aim is to align a contact plug (just called contact hereinafter) with its contact area as precisely as possible with the area of the doped region. In the case of present-day technology generations, the alignment tolerance (overlay) is typically 0.35 F, where F is the minimum structural dimension that can be produced.

The self-aligned contact-making methods (self-aligned contact, SAC) have proved to be advantageous for forming a large, effective contact area between the doped regions and the contacts. In the case of such a method, lateral spacers and an insulation cap which encapsulate a word line or gate, for example, are used to etch out a space that lies between two spacers and is filled with an insulator in a highly selective etching process without the alignment error of the resist mask used for the contact opening having an effect. The position of the contact is defined solely by the word lines and their spacers.

The contacts are thereby applied exactly to the contact doping regions. The latter have previously been implanted in a self-aligned manner in addition to the word lines and spacers. A higher packing density of the contacts and an improved reproducibility are thereby achieved.

Previous self-aligned methods for forming contacts are also associated with disadvantages, however. By way of example, contacts which are formed by means of salicide technology and in which sputtered-on metal layers are subjected to a siliconization process are subject to restrictions in the selection of the material and lead to consequential damage in the components at high temperatures in the subsequent processes. Moreover, in this technology, problems arise with regard to the linking of the contacts to difficult surface topographies, such as in the case of so-called strap contacts, for instance.

Self-aligned contacts with the aid of hole-type contact masks at word lines situated in an insulating manner are associated with the disadvantage that, on account of the above-specified tolerance of 0.35 F for the required positional accuracy by means of a mask process, a minimum width of 1.7 F is required for the word line ridge provided with doped regions from both sides.

Furthermore, there is the problem in this case that, with progressive reduction of the structural dimensions in the components, the aspect ratios of the trenches, i.e. the ratio of depth to width of the trench between the word lines or gates of field-effect transistors, become larger and larger. In this case, so-called voids arise to an increased extent in the course of filling with an insulator. As a result, short circuits between adjacent contacts may arise during the filling of the contact holes with conductive contact material.

So-called "Line type Self-Aligned Contacts" are known as a solution. In this case, transversely with respect to the word lines, an elongate hole is opened in the insulator deposited on the word lines. The corresponding etching process stops with high selectivity on the contact doping regions and on the spacers encapsulating the word line and on the insulation covering cap. Afterward, conductive contact material is deposited and planarized back to an extent such that, when the insulation cap of the word lines is uncovered, the filled contact material is separated into two partial regions on the two sides of the ridge. The problem of voids arising in closely adjacent contact openings is in this case reduced by the subsequent introduction of a spacer into the contact opening. A corresponding method is described in K. H. Yoon et al., 2001 Symposium on VLSI Technology, 10-4.

A further proposal, described in T. Yoon et al., 1999 Symposium on VLSI Technology 37–39, is based on firstly forming contact plugs and only then filling the spaces that remain between them with insulator material. In this case, voids that possibly arise do not pose a problem since the contacts have already been formed.

This method called pre-poly-plug technique ($P^3$) is also associated with disadvantages:

1. According to this technique, it is necessary to create the contacts for connection to the doped regions of the components in a common process step. Consequently, it is not possible to simultaneously adapt the contact material to all doping types (n-type doping or p-type doping) and dopant concentrations (for instance n-type doping or $n^+$-type doping) present in the integrated circuit.
2. The contacts produced at the outset are exposed to a number of subsequent thermal processes due to their early production. As a result, a considerable degradation of the component may occur at the contact area, as a result of which the relevant component may be damaged.
3. The formation of the contacts in accordance with the $P^3$ technique may necessitate an increased number of contact interfaces since contacts have to be stacked one above the other. However, contact interfaces represent a source for an increase in the resistance and for the reduction of the reliability of the contacts.

SUMMARY OF THE INVENTION

In one aspect, the present invention provides a method for making contact with components in which the restrictions with regard to the choice of materials and the disadvantageous thermal loading for the contacts are reduced and the number of contact interfaces in the case of stacked contacts is reduced.

The method according to the preferred embodiment of the present invention is based on the fact that, in a manner similar to that in the case of the $P^3$ technique, a contact plug preferably made of polysilicon is formed on the doped region of an integrated component prior to the formation of an insulator layer. In this case, in contrast to the $P^3$ technique, firstly a thin liner is deposited prior to the deposition of the contact plug layer. The liner enables the polysilicon plugs subsequently to be stripped out with high selectivity.

Polysilicon has the property of a high etching selectivity with respect to the customary insulator materials, such as silicon nitride or silicon dioxide. In accordance with the method according to the invention, the material of the contact is etched out again after the formation of the interlevel insulator and after the opening thereof with said high selectivity and replaced after the etching of the liner layer by a second conductive material which forms the actual contact.

According to embodiments of the present invention, after the production of the completely encapsulated word line structures, i.e., after the formation of the spacers and the insulation cap as elements of an "all-round insulation" of the word lines, the active region of the integrated component provided for making contact is provided with a contact doping.

Afterward, in a conformal deposition step, insulating material for forming a thin liner is deposited on the substrate or the already formed word line structures of the integrated component. Silicon dioxide, silicon nitride or else other material with high etching selectivity with respect to silicon or polysilicon is preferably used as the liner.

The thickness of the liner is preferably far less than the minimum structural width F that can be resolved in the lithography method used. Advantageous values for the deposition thickness lie below 15 nm.

An oxidation of the substrate is also conceivable as an alternative to the liner deposition process. However, since a conductive material, for example polysilicon, deposited on the liner has to be removed in a later process step without damaging the substrate arranged below the liner, a minimum thickness is required for the liner layer. The minimum thickness should preferably not be less than 7 nm.

In a subsequent process step, a first conductive material is deposited on the liner. Polysilicon is preferably used for this purpose, but the method according to the invention is not restricted to this material. The material is ideally one which has a high etching selectivity with respect to both silicon dioxide and silicon nitride. An electrically conductive material is typically involved in this case. Since this material is removed again in a later process step, the property of conductivity is not necessary for the invention, however. This layer is then planarized back as far as the covering layer of the word line structures, preferably by means of a CMP method.

In a further process step, a mask structure, preferably a hard mask structure, is formed by a hard mask layer being deposited on the planarized surface and being patterned by means of photolithography and anisotropic etching using a resist mask. The hard mask structure covers the conductive material at least in the partial region in which the later contacts are intended to be formed. In this case, the hard mask structure is arranged in such a way that the first doped region which is intended to be connected by a contact is at least partially covered. The patterning of the conductive layer is defined in a further process step by means of an anisotropic etching which, in the region of the edge of the hard mask structure, brings about an ideally perpendicular cut through the conductive material.

The hard mask structure is preferably formed with the aid of lithographic patterning and anisotropic plasma etching. In an etching step, preferably carried out anisotropically, the first conductive material is then selectively removed where it is not covered by the hard mask structure.

A dielectric layer for forming an interlevel insulator is subsequently deposited, preferably by means of chemical layer deposition (CVD). This may involve for example an $SiO_2$ layer formed in a TEOS method. If a layer made of silicon dioxide was likewise used for the hard mask structure, then it is possible, according to the invention, to integrate this into the interlevel insulator layer, i.e., it is not removed again prior to the deposition of the interlevel insulator layer. However, it is also possible to remove the hard mask structure beforehand.

The interlevel insulator layer is then planarized, preferably by means of a CMP method. Numerous alternatives emerge for this according to the invention:

In accordance with a first embodiment, the planarization is effected until a point in time at which the later polysilicon plugs have been opened. These regions are then stripped out, to be precise isotropically and selectively with respect to the interlevel insulator and with respect to the underlying liner layer, preferably by wet-chemical etching. The regions of the liner layer uncovered by the previous step are then stripped out, likewise preferably by isotropic etching.

A first metal layer is subsequently deposited, preferably by means of a CVD method. In this case, the intended contact is formed in the uncovered contact doping regions.

Finally, the interconnect structure of the metal layer is produced, preferably by means of lithographic patterning and anisotropic etching. The first metal layer is at the same time the final metal layer and forms both the contact plug region and the interconnect region in this embodiment.

In accordance with a second embodiment, the processing up to the deposition of the first metal layer is effected as in the first embodiment. The first metal layer is then planarized back to the surface of the planarized interlevel insulator layer, preferably by means of a CMP method. A second metal layer is subsequently deposited, preferably by means of a PVD method. In the open regions of the first metal layer, the contact plug regions, a contact is thereby formed between the lower, first metal layer and the overlying, second metal layer.

Finally, the interconnect structure of the second metal layer is produced, preferably by means of lithographic patterning and anisotropic etching. In this embodiment, the first metal layer forms the contact plugs and the second metal layer forms the interconnects.

In accordance with a third embodiment, the processing up to the first metal layer being planarized back is effected in the manner described for the second embodiment. A second partial layer of the interlevel insulator is then deposited, preferably by means of a CVD method. This second partial layer of the interlevel insulator is then patterned by trenches corresponding to the later interconnect structures being introduced into said layer by lithographic patterning and anisotropic etching. This procedure is also known as the damascene technique, a first step of which has been carried out up to this point.

In this case, the depth of the trenches is processed slightly deeper than the surface of the planarized-back first metal layer. A second metal layer is subsequently deposited, preferably by means of a CVD method. In the open regions of the first metal layer, the contact plug regions, a contact is thereby formed between the lower, first metal layer and the overlying, second metal layer.

Finally, the second metal layer is planarized back to the surface of the second partial layer of the interlevel insulator, preferably by means of a CMP method, which corresponds to the second step of the damascene technique. In this embodiment, the first metal layer forms contact plugs and the second metal layer forms interconnects.

In accordance with a fourth embodiment, the processing up to the planarizing opening of the polysilicon plugs is effected as in the first embodiment. A second partial layer of the interlevel insulator is then deposited, preferably by means of a CVD method. This second partial layer of the interlevel insulator is then patterned by contact holes being introduced therein over the polysilicon plugs by lithographic patterning and anisotropic etching. In this case, the depth of said contact holes is processed slightly deeper than the surface of the planarized-back polysilicon plugs.

Afterwards, the polysilicon plugs are stripped out, to be precise isotropically and selectively with respect to the interlevel insulator and with respect to the underlying liner layer, preferably by wet-chemical etching. The regions of the liner layer uncovered by the previous step are then stripped out, likewise preferably by isotropic wet etching.

A first metal layer is subsequently deposited, preferably by means of a CVD method. In this case, the intended contact is formed in the uncovered contact doping regions.

Finally, the interconnect structure of the first metal layer is produced, preferably by means of lithographic patterning and anisotropic etching. In this embodiment, the first metal layer is at the same time the final metal layer and forms both the contact plug and the interconnect region.

In accordance with a fifth embodiment, the processing up to the opening of the contact windows in the second partial layer of the interlevel insulator is effected in the manner described for the fourth embodiment, i.e. the first step of the dual damascene patterning is identical to that described there.

A second patterning of the partial layer of the interlevel insulator is subsequently performed by trenches additionally being introduced into the second partial layer by lithographic patterning and anisotropic etching, said trenches corresponding to the later interconnect structures, i.e. the second step of the dual damascene patterning. In this case, the depth of said trenches is processed in a fashion smaller than the surface of the polysilicon plugs.

Afterward, these are stripped out, isotropically and selectively with respect to the interlevel insulator and with respect to the underlying liner layer, preferably by wet-chemical etching. The regions of the liner layer uncovered by the previous step are then stripped out, preferably by isotropic wet etching.

A first metal layer is subsequently deposited, preferably by means of a CVD method. In this case, the intended contact is formed in the uncovered contact doping regions. Finally, the deposited metal layer is planarized back to the surface of the second partial layer of the interlevel insulator, preferably by means of a metal CMP method, i.e., a third step of the dual damascene patterning. In this embodiment, the first metal layer is at the same time the final metal layer and forms both the contact plug region and the interconnect region.

In accordance with a sixth embodiment, the planarization of the interlevel insulator layer, in contrast to the first to fifth embodiments, is not effected up to the opening of the polysilicon plugs, but rather only until a planar surface of the interlevel insulator layer has been produced. In this case, between the planarized surface of the interlevel insulator and the surface of the underlying word line or gate plane, there remains a sufficient thickness of interlevel insulator material for the electrical insulation of the interconnect structure to be formed later with respect to the surface of the word line or gate plane.

The interlevel insulator is then patterned by trenches being introduced into the interlevel insulator by lithographic patterning and anisotropic etching, said trenches corresponding to the later interconnect structures (first step of the dual damascene patterning). In this case, the depth of said trenches is processed slightly deeper than the surface of the polysilicon plugs.

The polysilicon plugs are subsequently stripped out, to be precise isotropically and selectively with respect to the interlevel insulator and with respect to the underlying liner layer, preferably by wet-chemical etching. The regions of the liner layer uncovered by the previous step are then stripped out, likewise preferably by isotropic wet etching.

A first metal layer is subsequently deposited, preferably by means of a CVD method. In this case, the intended contact is formed in the uncovered contact doping regions. Finally, the deposited metal layer is planarized back to the surface of the second partial layer of the interlevel insulator, preferably by means of a metal CMP method, i.e., a third step of the dual damascene patterning. In this embodiment, the first metal layer is at the same time the final metal layer and forms both the contact plug region and the interconnect region.

In accordance with a seventh embodiment, the processing up to the planarization of the interlevel insulator is effected as described for the sixth embodiment. The interlevel insulator is then patterned by contact holes being introduced into the interlevel insulator over the polysilicon plugs by lithographic patterning and anisotropic etching (first step of the dual damascene patterning). In this case, the depth of said contact holes is processed slightly deeper than the surface of the planarized-back polysilicon plugs.

A second patterning of the interlevel insulator is then effected by trenches being additionally introduced into the interlevel insulator by lithographic patterning and anisotropic etching, said trenches corresponding to the later interconnect structures (second step of the dual damascene patterning). In this case, the depth of said trenches is slightly deeper than the surface of the polysilicon plugs.

The polysilicon plugs are subsequently stripped out, to be precise isotropically and selectively with respect to the interlevel insulator and with respect to the underlying liner layer, preferably by wet-chemical etching. The regions of the liner layer uncovered by the previous step are then stripped out, likewise preferably by isotropic wet etching.

A first metal layer is subsequently deposited, preferably by means of a CVD method. In this case, the intended contact is formed in the uncovered contact doping regions. Finally, the deposited metal layer is planarized back to the surface of the interlevel insulator, preferably by means of a metal CMP method, i.e., a third step of the dual damascene patterning. In this embodiment, the first metal layer is at the same time the final metal layer and forms both the contact plug region and the interconnect region.

In accordance with an eighth embodiment, the processing up to the planarization of the interlevel insulator is effected as described for the seventh embodiment. The polysilicon plugs are then stripped out, to be precise isotropically and selectively with respect to the interlevel insulator and with respect to the underlying liner layer, preferably by wet-chemical etching. The regions of the liner layer uncovered by the previous step are then stripped out, likewise preferably by isotropic wet etching.

A first metal layer is subsequently deposited, preferably by means of a CVD method. In this case, the intended contact is formed in the uncovered contact doping regions. Finally, the interconnect structure of the first metal layer is produced, preferably by means of lithographic patterning and anisotropic etching. In this embodiment, the first metal layer is at the same time the final metal layer and forms both the contact plug region and the interconnect region.

In accordance with a ninth embodiment, the processing up to the deposition of the first metal layer and thus up to the contact formation on the contact doping regions is effected as described in the eighth embodiment. The first metal layer is then planarized back to the surface of the interlevel insulator, preferably by means of a metal CMP method. A second metal layer is subsequently deposited, preferably by means of a PVD method. In the open regions of the first metal layer, the contact plug regions, a contact is thereby formed between the lower, first metal layer and the overlying, second metal layer.

Finally, the interconnect structure of the second metal layer is produced, preferably by means of lithographic patterning and anisotropic etching. In this embodiment, the first metal layer forms the contact plugs and the second metal layer forms the interconnects.

After the production of the contacts and interconnects as described in the nine different embodiments, the further metallization construction is effected in the customary manner corresponding to the prior art.

Accordingly, according to the invention, the plug formed by the first conductive material is only used as a shaping sacrificial material which is ultimately removed and replaced by the final, second conductive material. The advantage is that, during the incorporation of the first conductive material in the partial region on the doped region, arbitrary thermal processes can affect this material without resulting in damaging effects on the second conductive material that is to be introduced later. By way of example, it is thereby possible to avoid degrading reactions and diffusion processes with the contact doping region and mechanical stresses in the contact or at the contact interfaces.

In particular, the liner in the partial region as a thin boundary layer between the polysilicon and the silicon substrate ensures that the substrate interface of the doped region does not degrade.

A further advantage of embodiments of the present invention is that particularly high aspect ratios of the contact are possible by virtue of the very high selectivity of the silicon etching with respect to the materials silicon nitride and silicon oxide.

Further advantages of certain embodiments consist in being able to provide in particular even individual transistors—in contrast to the transistors in the array of DRAM memories—even in the case of a minimal gate length with a contiguous ridge on a mask with contacts on both sides of the gate. This in turn means an advantage for the power and the packing density of the transistors produced in this way.

However, this also results in an advantage for the requirements for the resolution for the lithographic patterning, i.e. ridges can be resolved more easily than point contacts, and the requirements made of the process stability of the mask structure (ridges are stabler than point contacts). The separate patterning of the interconnect terminals that is necessary for some embodiments according to the invention may likewise be performed with relaxed structural and alignment requirements.

A further advantage is that, in the first and the fourth to eighth embodiments, contact plugs and interconnect ridge are produced in a common process, thereby avoiding a contact interface between contact plug and interconnect in these embodiments. This results in lower and more reliable lead resistances.

On the other hand, in the second, third and ninth embodiments, contact plugs and interconnect ridges are deposited in separate process steps and may thus also be made of different material. As a result, a good adaptation to the somewhat different functions of contact plug and interconnect is possible, as required, through a corresponding choice of the material of the metal layers.

Through a suitable choice of the material for the second electrically conductive material, it is also possible, by way of example, to realize aluminum metallizations with aluminum contacts. However, arbitrary other materials such as metal compounds comprising titanium, tungsten etc. are also possible. However, polysilicon or other electrically conductive materials may also be used as the second electrically conductive material.

BRIEF DESCRIPTION OF THE DRAWINGS

The invention will now be explained in more detail using 6 exemplary embodiments with the aid of a drawing, in which:

FIGS. 1–11 show a first exemplary embodiment for producing a contact to a field-effect transistor with a sequence of cross-sectional profiles (a) and plan views (b), respectively;

DETAILED DESCRIPTION OF ILLUSTRATIVE EMBODIMENTS

Figure 4:
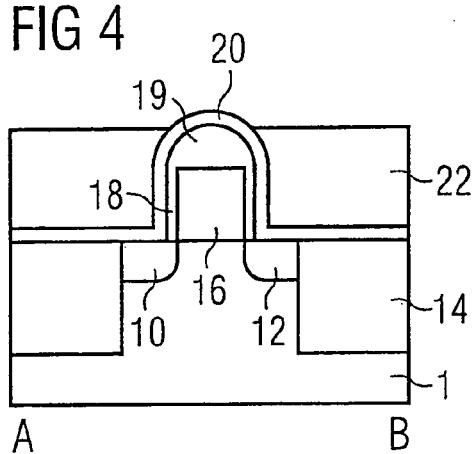

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1–11 show a first exemplary embodiment for producing the contact-connection to an individual field-effect transistor with a uniform metallization material for the contact plug region and interconnect region without a contact interface between the two regions. In this case, the interconnects are realized by means of conventional ridge patterning. The production uses two mask and two chemical mechanical polishing (CMP) steps. The production sequence is illustrated on the basis of cross sections through the structure for essential process stages.

The cross-sectional profiles shown reproduce a sequence of process steps according to the invention in accordance with the abovementioned first embodiment. FIG. 1a shows a cross-sectional profile and FIG. 1b a plan view of a field-effect transistor 2 in an initial situation for the method. The field-effect transistor 2 is formed in the substrate 1 and comprises a first doped region 10, a second doped region 12, a word line or gate 16 with a pad terminal depicted only by way of example, an all-round insulation comprising lateral oxide spacers 18 and a nitride cover 19, and also a shallow trench isolation (STI) 14. The cross-sectional profile shown in FIG. 1a is shown along a line A-B in the plan view of FIG. 1b.

In a conformal deposition process, a liner 20 made of silicon dioxide is deposited onto the surface of these structures (FIG. 2). The liner 20 preferably has a thickness of about 15 nm. The width of the word line 16 is about 140 nm. The oxide spacer 18 has a thickness of 6 nm, while the nitride cover 19 has a thickness of 170 nm. The oxide spacer 18 can be formed with a particularly small thickness because, according to the invention, highly selective etching processes can be used for forming the contacts, so that the thickness removal at the oxide spacer 18 turns out to be only very small.

In a further process step, polysilicon 22 is deposited as first conductive material (FIG. 3). In this case, the deposition thickness is greater than the height of the gate stack comprising the word line 16 with the all-round insulation, i.e. the nitride cover 19, and the oxide liner 20. By means of chemical mechanical polishing (CMP) or etch back, as examples, the polysilicon layer 22 is planarized or thinned until the surface of the gate stack, i.e. the liner 20 on the nitride cover 19, has been uncovered, as can be seen in FIG. 4.

Figure 5A:
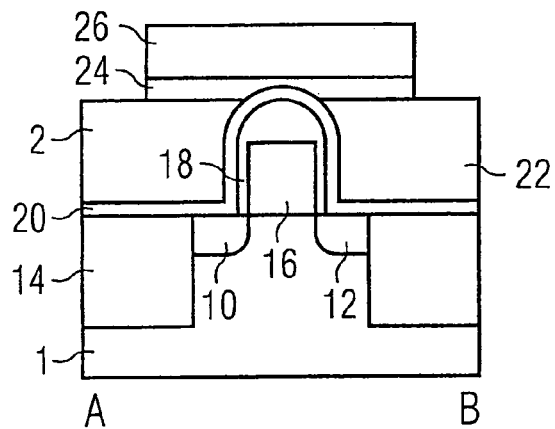
Figure 5B:
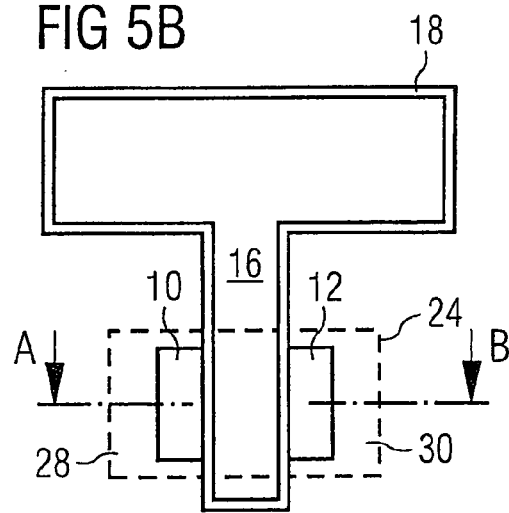
Figure 6:
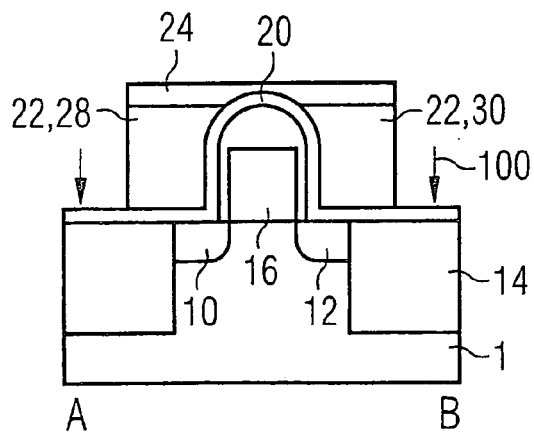

An antireflection layer (e.g., ARC or antireflection coating) and also a resist layer 26 are subsequently applied. In a lithographic projection step, a structure is formed in the resist 26 by means of a first mask and said structure is transferred into the antireflection layer. A hard mask structure 24 thus arises in the antireflection layer, as is shown in FIG. 5A. (FIG. 5B shows a corresponding plan view.) After the removal of the resist 26, the hard mask structure 24 formed in the antireflection layer is transferred into the polysilicon layer 22 in an anisotropic etching step 100. The anisotropic etching step 100 is ended when the liner 20 is uncovered (FIG. 6).

As a result of the anisotropic etching step 100, part of the polysilicon 22 remains in a first partial region 28 under the hard mask structure 24, as well as in a second partial region 30, which is isolated from the first partial region 28 by the gate stack with the word line 16, etc. The hard mask structure 24 has an extent of about 500 nm and covers the first doped region 10, the second doped region 12 and also the entire gate stack. The lithographic projection system has a minimum achievable resolution of 140 nm.

Figure 7:
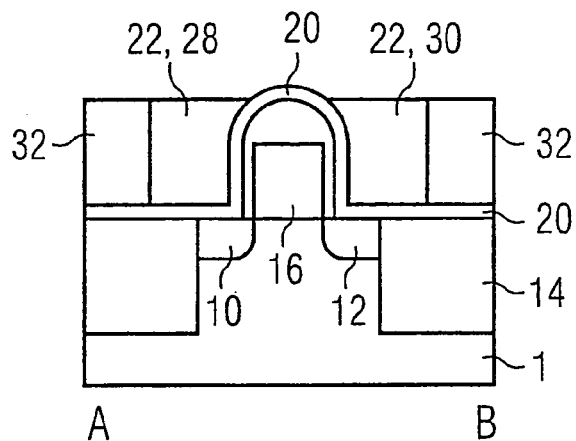
Figure 8:
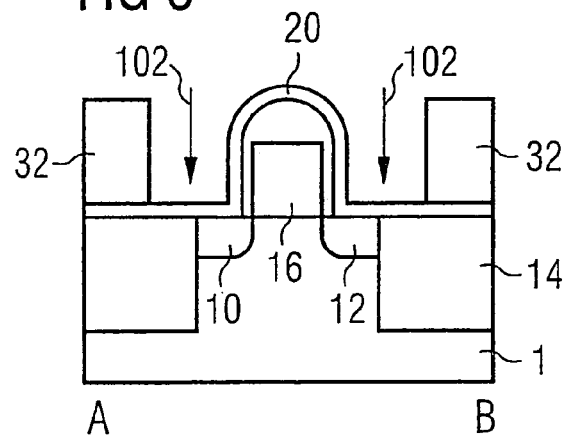

In the next method step, in a TEOS process for example, silicon dioxide is deposited as interlevel insulator 32 and planarized back as far as the opening of the residual polysilicon plugs (FIG. 7). In a selective, anisotropic etching process 102, the polysilicon 22, i.e. the provisional contact plug, is stripped out from the partial regions 28 and 30 (FIG. 8).

Figure 9:
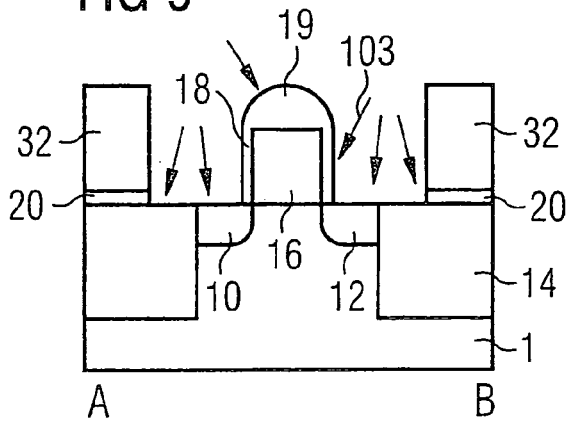
Figure 10:
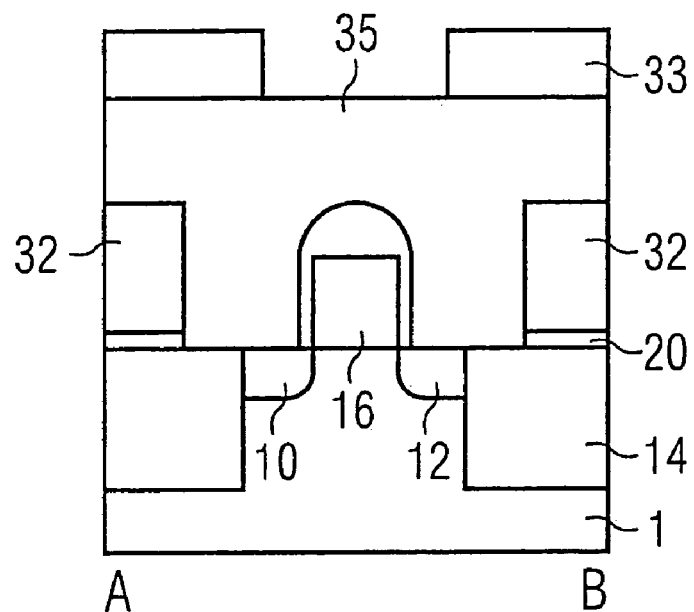
Figure 11:
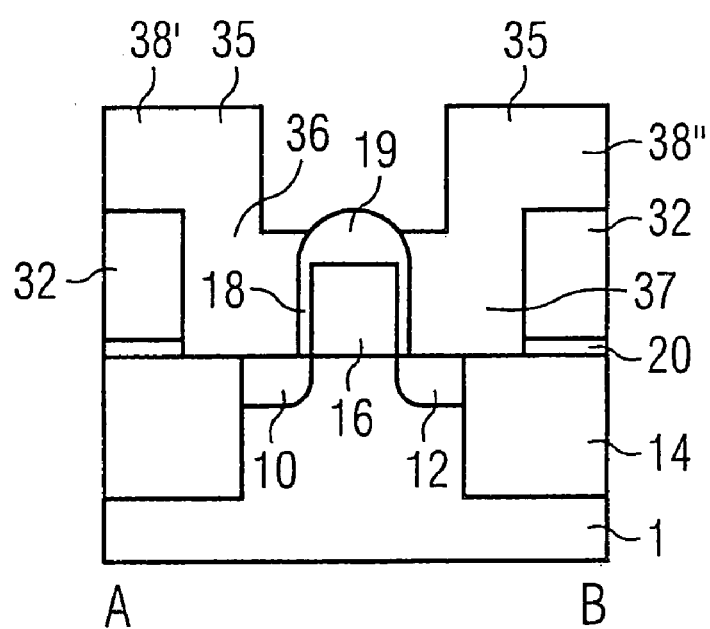

In an etching process 103 carried out isotropically, the oxide liner is then removed at the uncovered locations and in this case in particular on the contact doping regions in the substrate (FIG. 9). A second layer of the conductive material 35, for example a metal layer comprising tungsten silicide or aluminum, is deposited in a CVD method. A resist layer 33 applied thereto is patterned in a second mask step in such a way that resist ridges remain only along the interconnects that are desired in this metallization plane in accordance with the design. In particular, resist is removed from that region connecting the earlier partial regions 28 and 30 above the gate stack in the second conductive layer 35 (FIG. 10). In an etching step carried out anisotropically, the metal layer is then etched back anisotropically down to the nitride cover of the gate, thereby producing separate contacts 36 and 37 having no contact interface with the interconnects. On the left and right of the interconnects 38', 38", the interlevel insulator 32 has been uncovered during the etching step (in the cross-sectional illustration outside the plane of the drawing).

Figure 12:
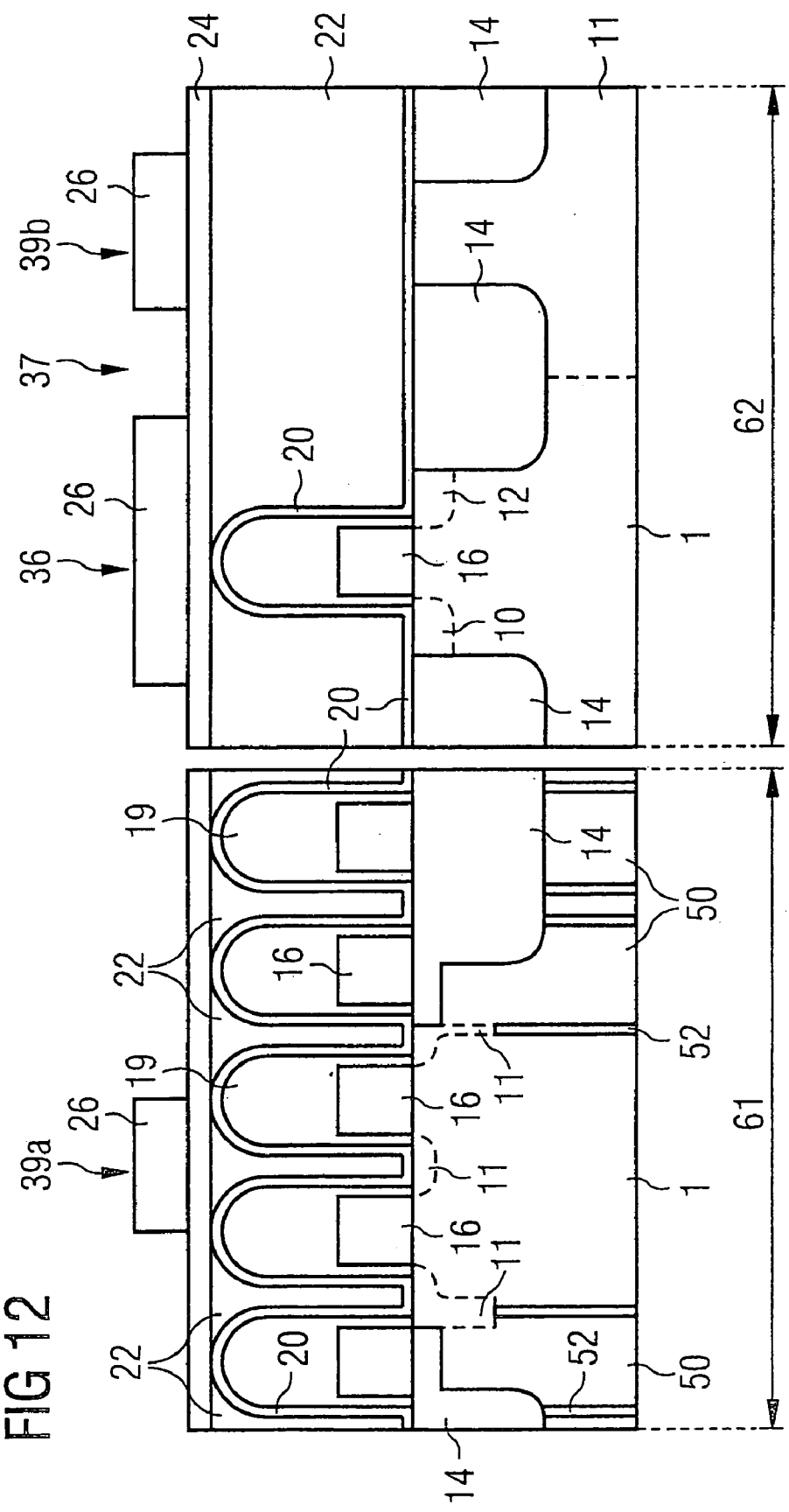
FIGS. 12–13 show a modification of the first exemplary embodiment for producing a contact for the formation of contacts in a DRAM memory cell arrangement.
Figure 13:
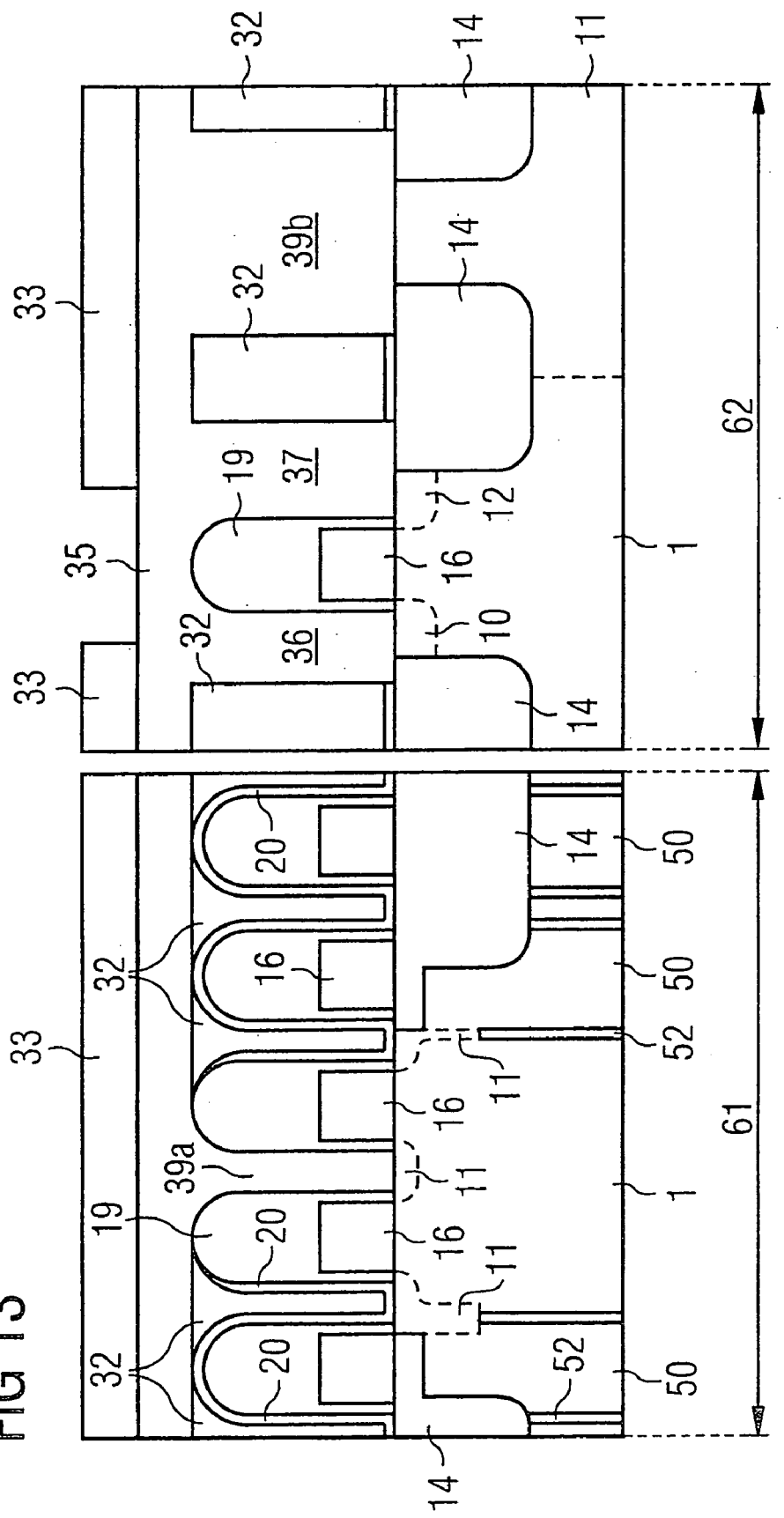

A further exemplary embodiment, which relates to the first embodiment, can be seen in FIGS. 12 and 13. These figures show the two mask steps (analogous to FIGS. 5 and 10) in the production of the contact-connection to a field-effect transistor (contacts 36 and 37), to the semiconductor substrate, so-called "bulk" contact 39b, and to the bit line contact area (bit line contacts 39a) for a DRAM memory based on a single-transistor memory cell with uniform metallization material for the contact plug region and interconnect region without a contact interface between the two regions. The memory cells comprise trenches 50 with insulation collars 52 and also doping regions 11 for the trench or bit line terminal.

In this case, the interconnects are realized by means of conventional ridge patterning. The production requires two mask steps and two planarization steps, as in the example of FIGS. 1–11.

Figure 14:
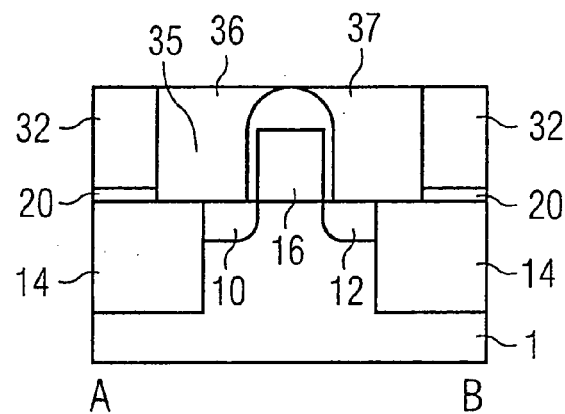
FIGS. 14–16 show a second exemplary embodiment for producing a contact to a field-effect transistor, developing the state shown in FIG. 9.
Figure 15:
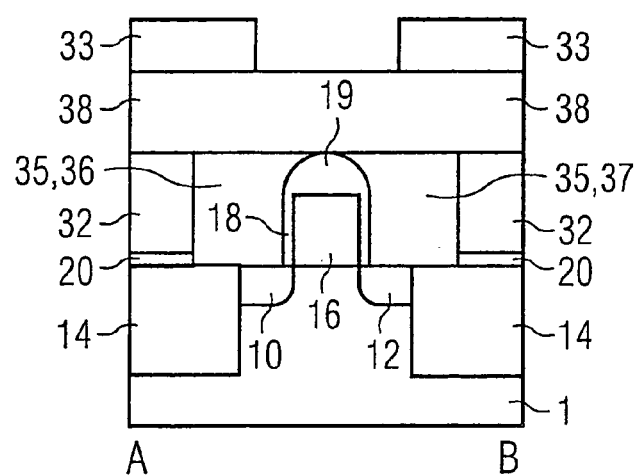
Figure 16:
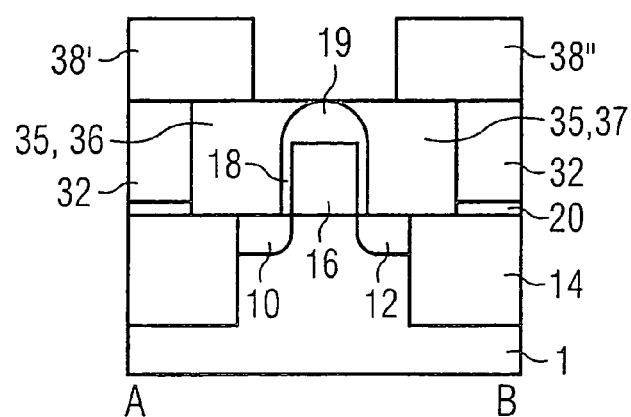

A further exemplary embodiment is shown in FIGS. 14–16. It corresponds to an example for the second embodiment (alternative) of the present invention, with the production of a contact-connection to a field-effect transistor with different metallization material for the contact plug and the interconnect region. Accordingly, a contact interface results between contact plugs 36, 37 and interconnects 38', 38".

In this case, the interconnects are realized by means of conventional ridge patterning. The production requires two mask and three planarization steps.

The starting point is the state illustrated in FIG. 9 after the opening and removal of the contact plugs and also the removal of the oxide liner on the contact doping regions. The second conductive material 35, preferably a metal layer, for example tungsten silicide, is deposited and planarized back (FIG. 14), so that it only fills the partial regions 28 and 30 and thus forms the contact plugs 36, 37.

A second metal layer, for example aluminum, for forming an interconnect layer 38 is deposited onto the planarized surface, e.g., by means of a PVD method. A contact interface arises between the two metal layers. A photosensitive resist 33 is applied on the second metal layer and, as in the first exemplary embodiment, exposed in a mask step in the region above the ridge (FIG. 15).

FIG. 16 shows the result, in the case of which the contacts 36, 37 have been separated and respectively connect an interconnect 38' or 38" to the doping regions 10 or 12.

A further exemplary embodiment corresponding to the sixth embodiment is shown in FIGS. 17 to 20. A contact-connection to a field-effect transistor with uniform metallization material for the contact and interconnect region without any interface between the two regions is produced in the case of this example. A damascene patterning is employed here. Two mask and three planarization steps are used.

Figure 17:
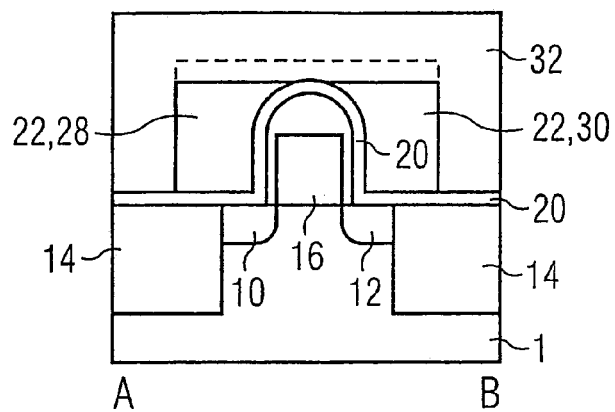
FIGS. 17–20 show a third exemplary embodiment for producing a contact to a field-effect transistor, developing the state shown in FIG. 9.
Figure 18:
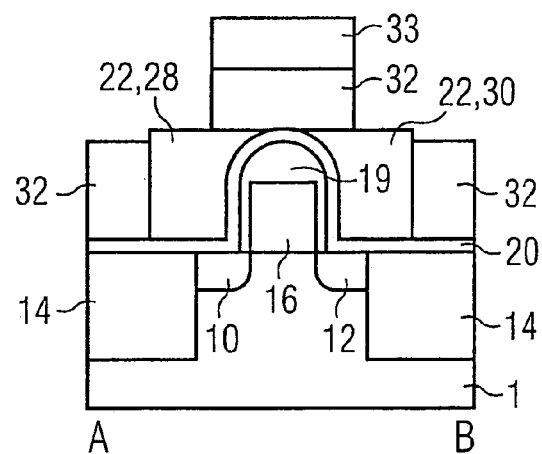
Figure 19:
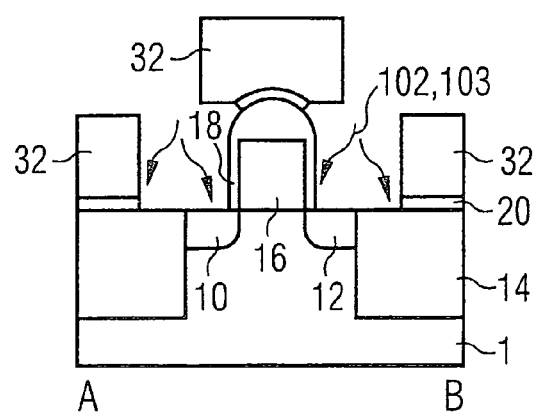

The starting point is the state illustrated in FIG. 6, i.e., the steps shown in FIGS. 1–6 are firstly to be employed in this case, too. FIG. 17 shows the deposition of a dielectric layer for forming the interlevel insulator 32. A resist 33 is applied to the surface, which, although it is planarized, is not planarized back therein to the polysilicon plugs of the first conductive layer 22, and said resist is exposed outside a region above the ridge in a mask step (FIG. 18). In an anisotropic etching, the exposed regions are transferred into the interlevel insulator 32 until the first conductive layer 22 is uncovered. The latter including the oxide liner 20 is removed in isotropic etching steps 102, 103 (FIG. 19).

Figure 20:
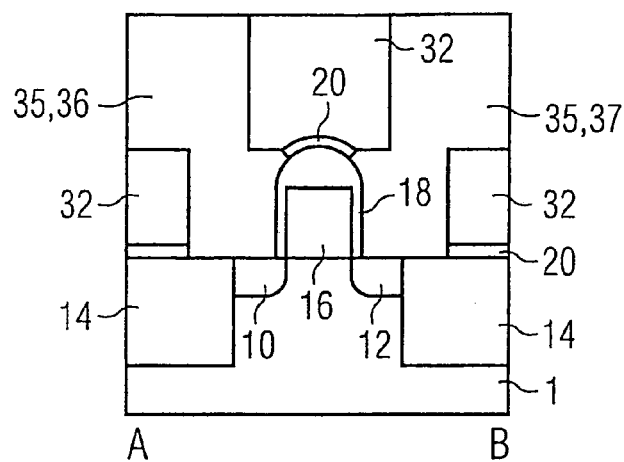

FIG. 20 shows the state after the completion of the contacts by deposition of a metal layer which is planarized back to the residual interlevel insulator 32. Since the interlevel insulator 32, on account of the patterning in the second mask step (see FIG. 18), brings about a separation of the partial regions 28, 30 above the ridge, the contacts 36, 37 are also separated from one another.

A further, fourth exemplary embodiment is shown in FIGS. 21 to 26. It represents an example of the seventh embodiment. What is produced in this case is a contact-connection to an individual field-effect transistor with a uniform metallization material for the contact plug and interconnect region, i.e., without the formation of a contact interface between the two regions. The interconnects are realized by means of dual damascene patterning in this case. The production requires three mask steps and three planarization steps (CMP).

Figure 21A:
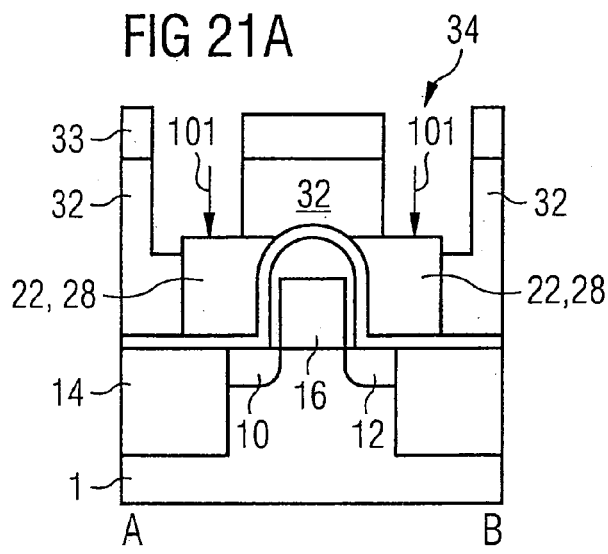
FIGS. 21–26 show a fourth exemplary embodiment for producing a contact to a field-effect transistor, developing the state shown in FIG. 17.
Figure 21B:
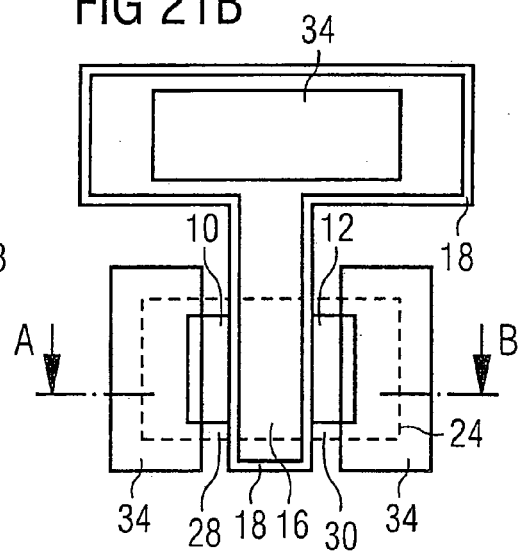

In contrast to the third exemplary embodiment, the process is continued starting from the state shown in FIG. 17 in the case of that in FIG. 21, i.e., the order of the process steps is reproduced by FIGS. 1–6, 17, 21–26.

In a further mask step—as is shown in FIG. 21—a resist 33 deposited on the planarized dielectric layer as an interlevel insulator is exposed in such a way that a respective opening is realized for each of the two partial regions 28, 30. The opening produced in the resist in this case is transferred into the interlevel insulator layer 32 in an etching process 101 carried out anisotropically. The openings 34 have a diameter of 180 nm with a mutual spacing of 200 nm.

The lithographic process is thus subject to relaxed requirements with regard to positional accuracy with respect to the resolution limit: the etching process 101 is ended as soon as the polysilicon 22 or the two partial regions 28, 30 are uncovered; in this case, the openings 34 do not necessarily need to meet the partial regions 28, 30 in an exactly centered fashion. Rather, they may also open said partial regions in a laterally offset fashion.

Figure 22:
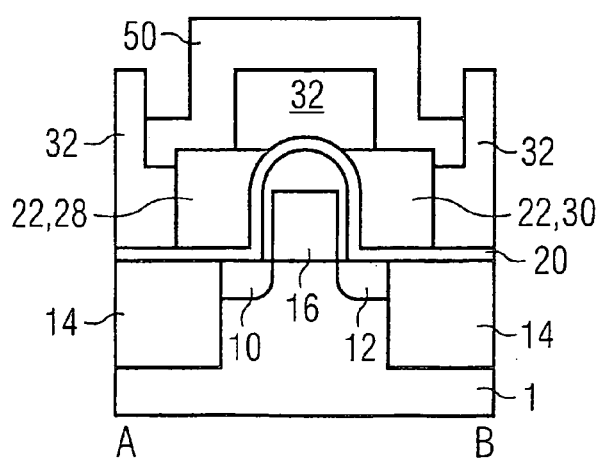
Figure 23:
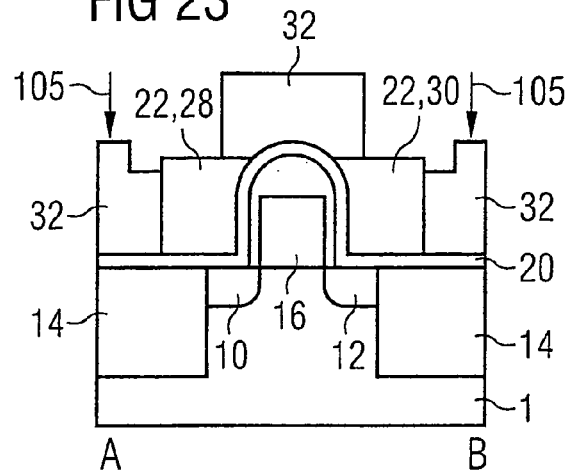

FIG. 22 illustrates the subsequent process step (third mask step), a further resist layer 50 being patterned by means of lithographic projection in such a way that the openings 34 and a ridge of the interlevel insulator 32 that has remained between them are covered. In an etching step 105, the structures for the interconnects 38', 38" are then transferred from the resist 50 into the interlevel insulator 32 (FIG. 23).

Figure 24:
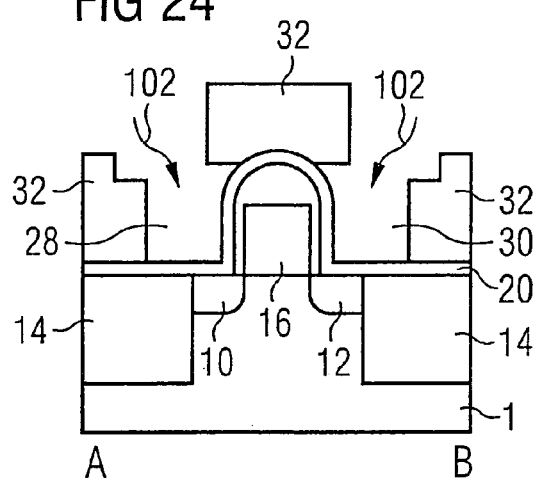
Figure 25:
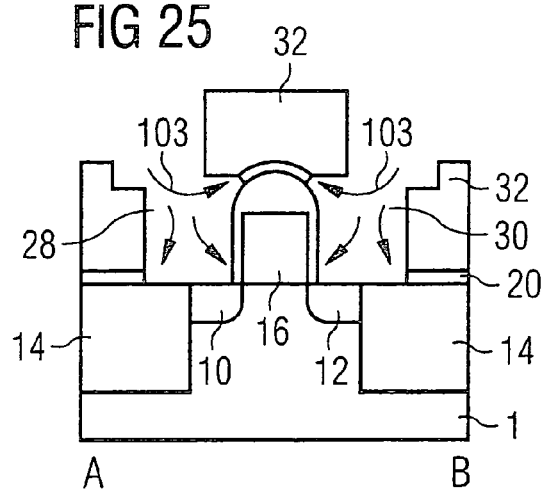

There then follows an etching step 102 that is preferably carried out isotropically for removing the polysilicon 22 from the first and second partial regions 28, 30 and afterward the removal of the liner 20 (FIGS. 24, 25).

Figure 26A:
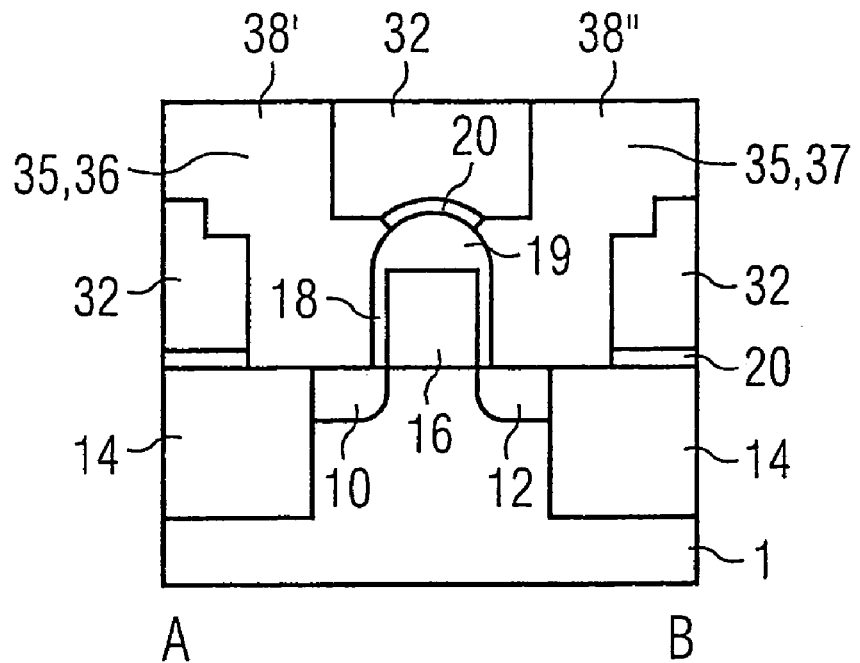
Figure 26B:
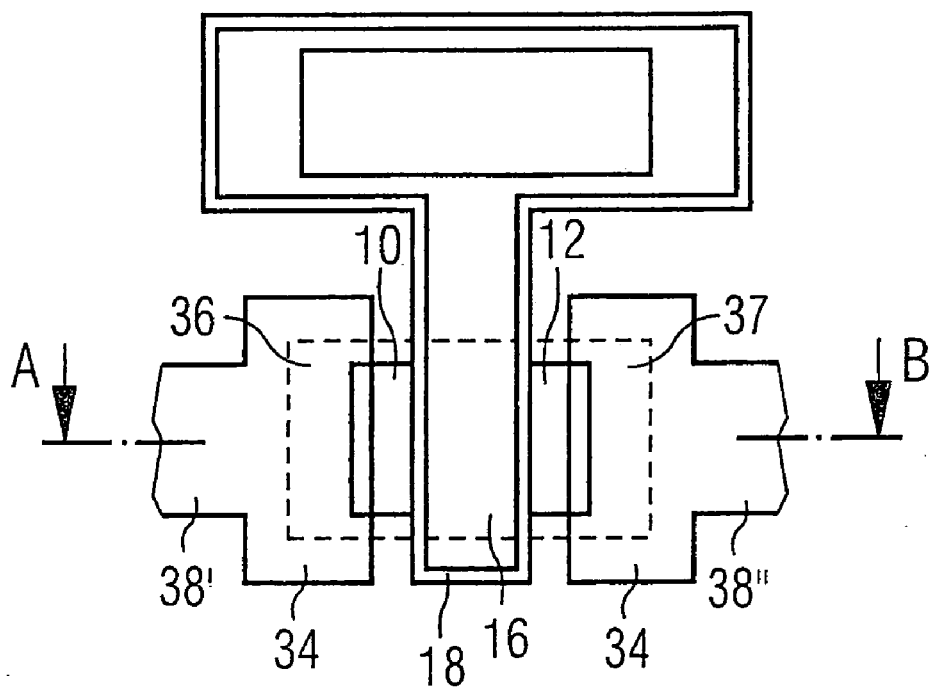

As can be seen in FIG. 26, in the trenches formed for the interconnects 38' and 38", the cavities of the partial regions 28, 30 and the openings 34, in a uniform deposition process, a layer comprising for example aluminum or preferably also tungsten silicide 35 is then deposited and planarized back. Consequently, there are no contact interfaces between the interconnects 38', 38" and the contacts 36, 37 (dual damascene process).

In this case, it should be noted that the process sequence for producing a contact-connection of an individual transistor of this fourth exemplary embodiment, analogously to the process steps of the first exemplary embodiment shown in FIGS. 12 and 13, can be applied identically to the same DRAM memory cell configuration shown there with bit line contacts, contacts to doping regions and bulk terminals in a uniform process.

A fifth exemplary embodiment can be seen in FIGS. 27 to 30. The process sequence shows a modification of the fourth exemplary embodiment and develops the state shown in FIG. 21. The process sequence is described by FIGS. 1–6, 17, 21, 27–30. The fifth exemplary embodiment describes an example of the eighth embodiment.

What is produced is a contact-connection to an individual field-effect transistor with uniform metallization material for the contact plug and interconnect region without a contact interface between the two regions. The interconnects are in this case realized by means of conventional ridge patterning. The production require three mask and two planarization steps.

Figure 27:
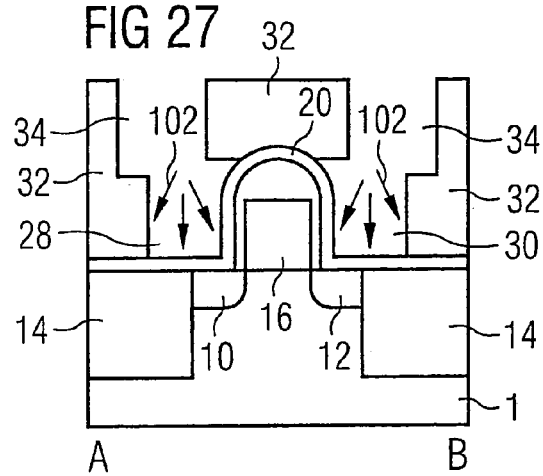
FIGS. 27–30 show a fifth exemplary embodiment for producing a contact to a field-effect transistor, developing the state shown in FIG. 21.

In an etching process 102 carried out isotropically, the polysilicon 22 is etched out from the first partial region 28 and the second partial region 30 selectively with respect to the silicon dioxide of the liner 20 and the interlevel insulator 32, as is shown in FIG. 27.

Figure 28:
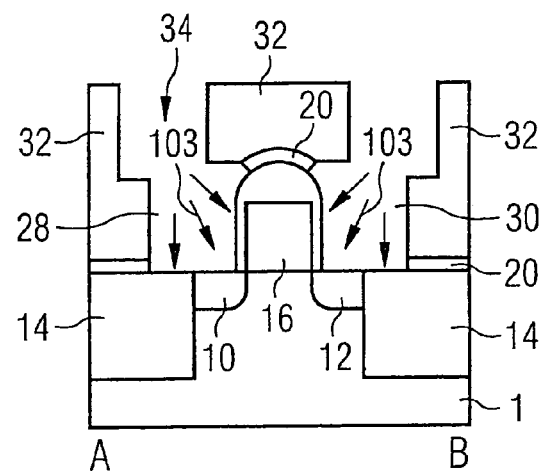
Figure 29:
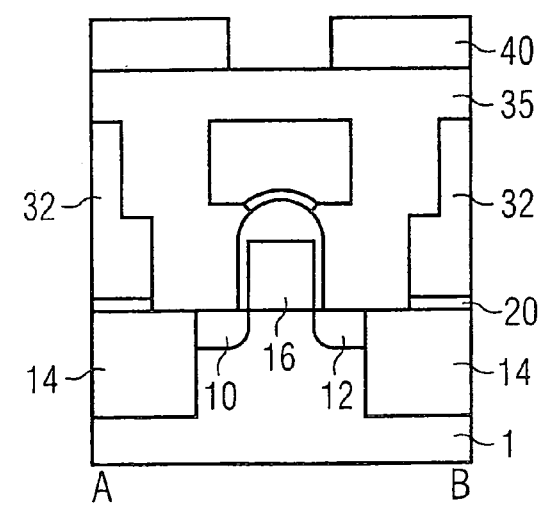
Figure 30:
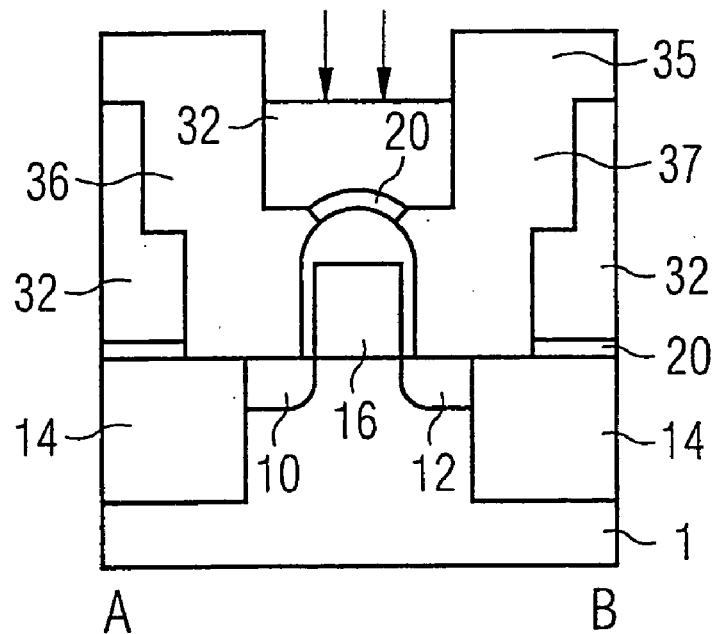

In a further etching step 103, the liner 20 is removed in the cavities produced which is illustrated in FIG. 28. The openings 34 and the partial regions 28, 30 are filled with a metal layer, for instance tungsten silicide 35 (FIG. 29). Since the liner 20 has been removed beforehand, there is now a direct interface between the first doped region 10, and respectively the second doped region 12, and the first metal layer of the tungsten silicide 35.

A resist layer 40 is applied and patterned lithographically in a third mask step (first mask step of the process sequence: FIG. 5, second mask step: FIG. 21), as is illustrated in FIG. 29. It is used to form the interconnects 38' and 38". The anisotropic etching 104 that brings this about is carried out until the interlevel insulator 32 is uncovered. In particular, this mask step separates the contacts 36 and 37 in the metal layer 35.

Consequently, final contacts 36, 37 to the respective doped regions 10, 12 have been formed in a self-aligned process.

Figure 31:
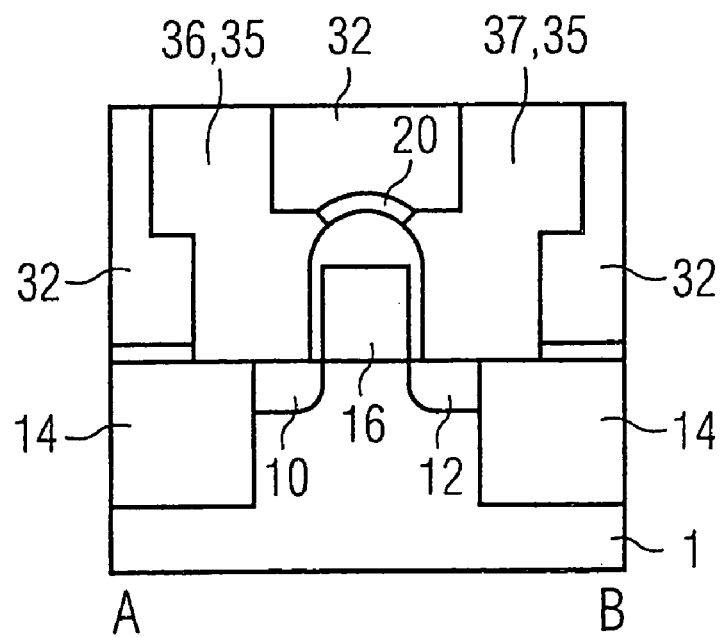
FIGS. 31–33 show a sixth exemplary embodiment for producing a contact to a field-effect transistor, developing the state shown in FIG. 28.
Figure 32:
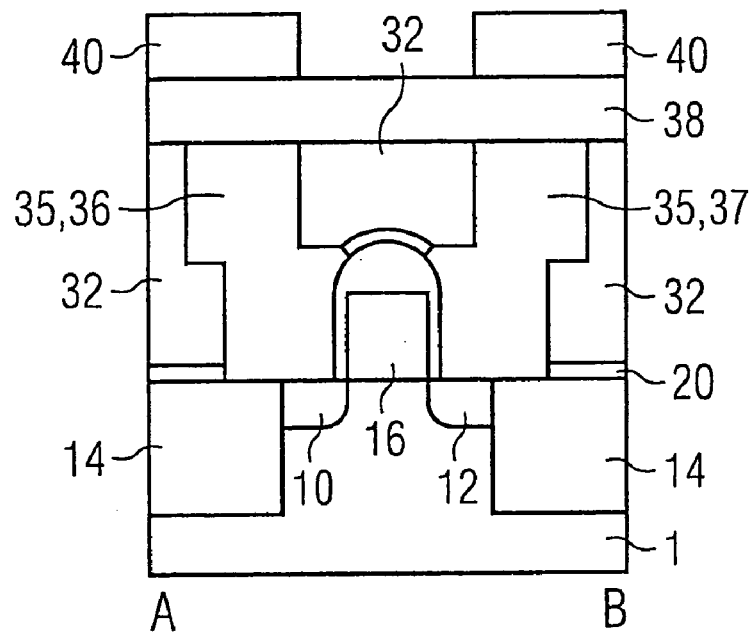
Figure 33:
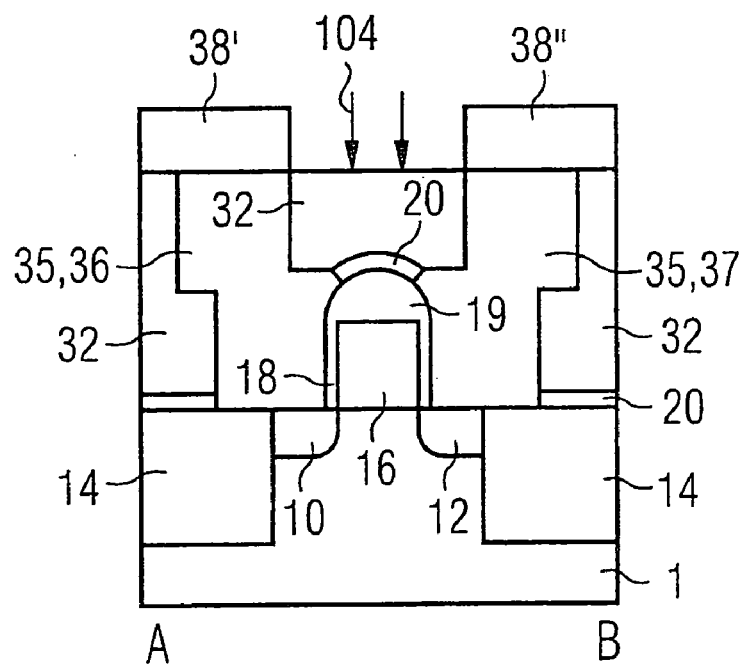

A sixth exemplary embodiment, which represents an example of the ninth embodiment, is to be seen as a modification of the fifth exemplary embodiment in FIGS. 31 to 33. It develops the state produced in FIG. 28.

What is produced in this case is a contact-connection to an individual field-effect transistor with different metallization material for the contact plug and interconnect region including a contact interface between the two regions. The interconnects are realized by means of conventional ridge patterning. The production requires three mask and three planarization steps.

The process sequence corresponds to the process stages illustrated in FIGS. 1–6, 17, 21, 27–28, 31–33.

The openings 34 and the partial regions 28, 30 are filled with a metal layer, for example tungsten silicide 35 (FIG. 31). Since the liner 20 has been removed beforehand, there is now a direct interface between the first doped region 10, and respectively the second doped region 12, and the tungsten silicide 35. Consequently, final contacts 36, 37 to the respective doped regions 10, 12 have been formed in a self-aligned process.

FIG. 32 illustrates the state after the PVD deposition of an electrically conductive layer comprising aluminum 38, which is formed into interconnects in a third mask step by means of an applied resist 33. This may be realized for example by means of a further etching process 104, as is illustrated in FIG. 33, for forming the interconnects 38', 38".

Although the present invention and its advantages have been described in detail, it should be understood that various changes, substitutions and alterations can be made herein without departing from the spirit and scope of the invention as defined by the appended claims.

What is claimed is:

1. A method for producing an electrically conductive contact for at least one contact connection region of an integrated component, the method comprising:
providing a semiconductor body with an integrated component disposed thereon and a contact connection area adjacent the integrated component;
conformally depositing an insulating material to form a liner over the integrated component;
depositing a sacrificial layer over the insulating material of the liner;
planarizing the sacrificial layer to uncover a surface of the liner over the integrated component;
forming a mask over the sacrificial layer;
anisotropically etching the sacrificial layer selectively with respect to the mask, the integrated component and the liner, so that the sacrificial layer at least partially covers the at least one contact connection region in a partial region masked from the etching operation by the mask;
depositing a dielectric layer to form an interlevel insulator;
removing portions of the interlevel insulator to at least partial uncover the sacrificial layer in the at least one partial region;
stripping-out the sacrificial layer selectively with respect to the dielectric layer;
stripping-out the insulating material forming the liner;
depositing at least one conductive layer to fill the at least first partial region such that an electrically conductive contact is formed.

2. The method as claimed in claim 1 wherein the integrated component includes a gate electrode and an all-round insulation of the gate electrode, the all-around insulation including a spacer and a nitride cover.

3. The method as claimed in claim 1 wherein patterning the sacrificial layer comprises patterning by means of a mask produced photolithographically.

4. The method as claimed in claim 1 wherein stripping-out the sacrificial layer selectively with respect to the dielectric layer comprises isotropic wet-chemical etching.

5. The method as claimed in claim 1 wherein stripping-out the insulating material forming the liner comprises isotropic wet-chemical etching.

6. The method as claimed in claim 1 wherein depositing at least one conductive layer comprises depositing at least one metal layer.

7. The method as claimed in claim 1, wherein the sacrificial layer comprises amorphous or polycrystalline silicon.

8. The method as claimed in claim 1, wherein the contact connection region of the integrated component comprises a first doped region formed in the semiconductor body.

9. The method as claimed in claim 1, wherein removing portions of the interlevel insulator comprises planarizing the interlevel insulator.

10. The method as claimed in claim 9 wherein the planarizing is accomplished by chemical mechanical polishing.

11. The method as claimed in claim 1 wherein removing portions of the interlevel insulator comprises:
planarizing the interlevel insulator to at least partially uncover a surface of the sacrificial layer;
depositing a second dielectric layer;
forming at least one opening in the planarized interlevel insulator by means of a second mask produced photolithographically; and
performing an anisotropic reactive ion etch to transfer the at least one opening into the interlevel insulator in order to at least partially uncover the sacrificial layer.

12. The method as claimed in claim 11 wherein depositing a second dielectric layer comprises performing chemical vapor deposition.

13. The method as claimed in claim 1 wherein removing portions of the interlevel insulator comprises:
planarizing the interlevel insulator to at least partially uncover a surface of the sacrificial layer;
depositing a second dielectric layer; and
performing a subsequent dual damascene process during which, in two successive steps, at least one opening and trenches for receiving interconnects are formed in the planarized interlevel insulator by means of a second mask produced photolithographically and are transferred into the interlevel insulator by means of etching, so that the sacrificial layer is at least partially uncovered and the trenches for holding the interconnects merge with the at least one opening.

14. The method as claimed in claim 13 wherein planarizing the interlevel insulator comprises chemical mechanical polishing the interlevel insulator.

15. The method as claimed in claim 13 wherein depositing a second dielectric layer comprises performing chemical vapor deposition.

16. The method as claimed in claim 1 wherein removing portions of the interlevel insulator comprises:
planarizing the interlevel insulator so that a top surface of the interlevel insulator is located substantially above the surface of the sacrificial layer; and
subsequently forming trenches in the planarized interlevel insulator.

17. The method as claimed in claim 16 wherein the trenches comprise trenches for receiving interconnects.

18. The method as claimed in claim 16 wherein the trenches are introduced by means of a further mask produced lithographically and in an anisotropic operation with a depth such that this depth, relative to the distance from the substrate surface, lies below the surface of the sacrificial layer that is at least partially uncovered by the etching operation.

19. The method as claimed in claim 16 wherein planarizing the interlevel insulator comprises chemical mechanical polishing the interlevel insulator.

20. The method as claimed in claim 1 wherein removing portions of the interlevel insulator comprises:
  planarizing the interlevel insulator so that a top surface of the interlevel insulator is located substantially above the surface of the sacrificial layer; and
  subsequently performing a dual damascene process during which, in two successive steps, at least one opening and trenches for receiving interconnects are formed in the planarized interlevel insulator by means of a second mask produced photolithographically and are transferred into the interlevel insulator by means of etching, so that the sacrificial layer is at least partially uncovered and the trenches for receiving the interconnects merge with the openings.

21. The method as claimed in claim 20 wherein planarizing the interlevel insulator comprises chemical mechanical polishing the interlevel insulator.

22. The method as claimed in claim 1 wherein removing portions of the interlevel insulator comprises:
  planarizing the interlevel insulator so that a top surface of the interlevel insulator is located substantially above the surface of the sacrificial layer; and
  forming at least one opening in the interlevel insulator, the opening preferably being introduced by means of a further mask produced lithographically and in an anisotropic etching operation with a depth such that this depth, relative to the distance from the substrate surface, lies below the surface of the sacrificial layer that is at least partially uncovered by the etching operation.

23. The method as claimed in claim 22 wherein planarizing the interlevel insulator comprises chemical mechanical polishing the interlevel insulator.

24. The method as claimed in claim 1 wherein depositing at least one conductive layer further comprises patterning the at least one conductive layer by means of a third mask produced lithographically and an anisotropic etching for transferring the mask into the conductive layer.

25. The method as claimed in claim 1 wherein depositing at least one conductive layer further comprises planarizing the conductive layer.

26. The method as claimed in claim 25 wherein planarizing the conductive layer comprises planarizing by means of chemical mechanical polishing.

27. The method as claimed in claim 26 wherein the planarization ends when the interlevel insulator is uncovered.

28. The method as claimed in claim 1 wherein depositing at least one conductive layer comprises:
  planarizing the conductive layer, the planarization being ended when the interlevel insulator is uncovered;
  depositing a further conductive layer; and
  performing an anisotropic etch by means of a third mask produced lithographically for the purpose of transferring the mask into the conductive layer.

29. The method as claimed in claim 28 wherein depositing a further conductive layer comprises depositing by means of physically enhanced chemical deposition.

30. The method as claimed in claim 28 wherein the conductive layer comprises a metal and wherein the further conductive layer comprises a metal.

31. The method as claimed in claim 1 wherein depositing at least one conductive layer comprises:
  planarizing the conductive layer, the planarization being ended when the interlevel insulator is uncovered;
  depositing a further dielectric layer;
  forming at least one trench for receiving interconnects in the further dielectric layer by means of a third mask produced lithographically in an anisotropic operation;
  depositing a further metal layer;
  planarizing the deposited further metal layer, the planarization being ended when the interlevel insulator is uncovered.

32. The method as claimed in claim 31 wherein depositing a further metal layer comprises depositing by means of chemical vapor deposition.

33. The method as claimed in claim 1 wherein the conductive layer comprises doped polysilicon.

34. The method as claimed in claim 1 wherein the conductive layer comprises a compound that includes metal.

35. The method as claimed in claim 34 wherein the conductive layer comprises an element selected from the group consisting of titanium nitride, tungsten silicide, titanium, tungsten, copper, and aluminum.

* * * * *